United States Patent [19]

Chen et al.

[11] Patent Number: 5,200,474

[45] Date of Patent: Apr. 6, 1993

[54] POLYIMIDE ADHESIVE COMPOSITION INCLUDING BARBITURIC ACID MODIFIER

[75] Inventors: Ker M. Chen; Jing P. Pan; Gwo Y. Shiau, all of Hsinchu; Tsung H. Wang; Wei C. Chang, both of Taipei, all of Taiwan

[73] Assignee: Industrial Technology Research Institute, Hsinchu, Taiwan

[21] Appl. No.: 571,139

[22] Filed: Aug. 22, 1990

[51] Int. Cl.$^5$ .............................................. C08L 79/00
[52] U.S. Cl. .................................... 525/426; 525/420; 428/473.5
[58] Field of Search ........................................ 525/426

[56] References Cited

U.S. PATENT DOCUMENTS

| | | | |
|---|---|---|---|
| 4,362,826 | 12/1982 | Yonezawa et al. | 525/426 |
| 4,985,509 | 1/1991 | Matuura et al. | 525/426 |
| 4,987,207 | 1/1991 | Yamaya et al. | 528/170 |
| 5,041,519 | 8/1991 | Pan et al. | 528/114 |

FOREIGN PATENT DOCUMENTS

| | | | |
|---|---|---|---|
| 0044626 | 3/1982 | Japan | 525/426 |
| 62141077 | 6/1984 | Japan . | |
| 2030122 | 2/1987 | Japan | 525/426 |
| 62278687 | 5/1989 | Japan . | |

*Primary Examiner*—Ana L. Carrillo
*Attorney, Agent, or Firm*—Scully, Scott, Murphy & Presser

[57] ABSTRACT

A polyimide adhesive composition is a reaction product of polyamic acid and bismaleimide (I) modified by barbituric acid (II) or the derivatives thereof. Once the present composition is directly coated onto copper foil, the bonding force is greatly improved as compared to compositions without (II) or (I) and (II). Therefore, the adhesive normally used in the manufacture of flexible printed circuits boards and tape automated bonding (TAB) is no longer necessary.

7 Claims, No Drawings

POLYIMIDE ADHESIVE COMPOSITION INCLUDING BARBITURIC ACID MODIFIER

This invention relates to a polyimide adhesive composition, and more particularly, relates to the use of a high adhesion polyimide composition as a substrate material which adhered directly to copper foil. These materials are suitable for preparing flexible printed circuit boards and tape automated bonding (TAB). They are also applicable to polyimide thin film packaging technology.

BACKGROUND OF THE INVENTION

Polyimides have been widespread use in the electronics industry, such as flexible printed circuit boards, tape automated bonding (TAB) and thin film package, due to the properties of high heat resistances and low dielectric constant. However, polyimides possess the disadvantage of lower adhesion to copper. An additional adhesive should be applied between copper foil and polyimides film to improve the bonding strength. Since the heat resistance of the adhesive used was weaker than that of polyimides substrate, the resulted flexible printed circuit board and tape automated bonding (TAB) will exhibit poor quality. To develop a construction with non-adhesive will greatly improve the overall performance.

The use of a modified polyimide to enhance the bonding strength between polyimide substrate and copper foil has been disclosed by prior art, such as Japanese Kokai Tokkyo Koho JP 62-278687 and SAMPE Journal July/August 1988. These known references described that the adhesion of polyimide substrate was improved by the incorporation of siloxane segments into a polyimide backbone polymer. However, siloxane incorporation will greatly reduce glass-transition temperature of polyimide and cause phase-separation phenomenon. Therefore, an homogeneous polyimide film cannot be produced.

Japanese Kokai Tokkyo Koho JP 61-48318 and 62-141077 disclosed incorporating bismaleimides into polyimides material for improving thermal resistance of the final product. However, these prior Patents did not effectively enhance the adhesion between copper foil and polyimide substrate.

SUMMARY OF THE INVENTION

Therefore, a main object of this invention is to provide high adhesion and high heat-resistant polyimides which can eliminate the use of an adhesive between copper foil and polyimides substrate for the fabrication of flexible printed circuit board, tape automated bonding (TAB) and thin film package.

According to this invention, the high adhesion polyimide composition is a reactive product of polyamic acid and bismaleimide which was modified by barbituric acid or the derivatives thereof. The bismaleimide modification was carried out on the condition that the molecular ratio of barbituric acid to bismaleimide was between ½ and 1/10, the reaction temperature was at 100° to 130° C. and the reaction period was 0.5 to 6 hours. Polyamic acid used in this invention was the reactive product of dianhydride and diamine according to any known methods. Bismaleimide modified by barbituric acid was mixed with polyamic acid at room temperature to form a new mixture with 10-15% solids content. Thus, the percent solids of the modified bismaleimide amounted to 5 to 15 percent by weight of the total solids.

Polyamic acid suitably used in this invention was the reactive product of dianhydrides and diamines. The dianhydrides include the general formula:

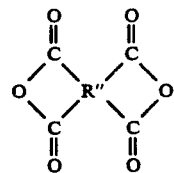

where R" is tetravalent radical which consists of at least two carbon atoms and may be substituted or nonsubstituted aromatic group, an aliphatic group, a cycloaliphatic group or heterocyclic group which contains at least one of the atoms N, O, or S, or different radicals which are bonded directly or by means of one of the following radicals: alkylene, dioxyalkylene, arylene, $-SO_2-$, $-O-$, $-CO-$,

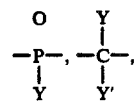

$-NY-CO-X-CO-NY-$, $-CO-NY-X-NY-CO-$, $-CO-O-X-O-CO-$, $-O-CO-X-XO-O-$, and $-CO-NY-NY-CO-$, where X is a bivalent alkylene radical, dioxyalkylene radical, or arylene radical, and Y and Y' are alkyl radicals, aryl radicals, or cycloaliphatic radicals. The dianhydride is a carbonylated compound capable of forming an internal diimide which has two pairs of carbonylated groups, whereby each of the groups is bonded at one side to a carbon atom of a single tetravalent radical and at the other side to an oxygen atom, while the carbonylated groups which belong to a single pair, are separated by three carbon atoms at most.

In this invention, tetrahadrofuran tetracarboxylic acid dianhydride, cyclopentane tetracarboxylic dianhydride, or bicyclo-[2,2,2]-oceten-(7)-2,3,5,6-tetracarboxylic-2,3:5,6-dianhydride may be used, aromatic dianhydrides are preferred Example of suitable aromatic dianhydrides include: pyromellitic dianhydride, 2,3,6,7-naphthalene tetracarboxylic dianhydride, 3,3',4,4'-diphenyl tetracarboxylic dianhydride, 1,4,5,8-naphthalene tetracarboxylic dianhydride, 1,2,5,6-naphthalene tetracarboxylic dianhydride, bis(3,3-dicarboxyphenyl) sulfone dianhydride and bis(3,4-dicarboxyphenyl) ether dianhydride.

Diamines suitably used in this invention correspond to the following formula: $H_2N-R'-NH_2$, wherein R' is selected from the groups consisting of aromatic group, aliphatic group, cycloaliphatic group and aliphatic group containing siloxane. Examples of typical diamines are as follows: ethylene diamine, propylene diamine, tetramethylene diamine, pentamethylene diamine, hexamethylene diamine, 2-ethylhexylene diamine, nonamethylene diamine, decamethylene diamine, 2,11-diamino-dodecane and the like; meta-phenylene diamine, para-phenylene diamine, 2,2'-naphthalene diamine, 4,4'-biphenylene idamine, methylene dianiline-(4,4'-diaminodiphenyl methane), ethylene dianiline-(4,4'-diaminodiphenyl ethane), propylene dianiline-(4,4'-diaminodiphenyl propane) and the like, bis-(para-amino-cyclohexyl)N-phenyl amine, bis-(para-amino-cyclohexyl)N-methyl amine, hexafluoroisopropylidene-bis-(4-phenyl amine), 4,4'-diamino-diphenyl methane, 4,4'-diamino-diphenyl ethane, 4,4'-diamino-diphenyl propane, 4,4'-diamino-diphenyl butane, 2,6-diamino-pyridine, bis-(4-amino-phynyl) diethyl silane, bis-(4-amino-phynyl) diphenyl silane, bis-(4-amino-phynyl) ethyl phosphine oxide, bis-(4-amino-phynyl) phenyl phosphine oxide, bis-(4-amino-phynyl)-N-phenylamine, bis-(4-amino-phynyl)-N-methylamine, 3,3'-dimethyl-4,4'-diamino-biphenyl, 3,3'-dimethoxybenzidine, 2,4-bis(o-amino-t-butyl)toluene, bis(para-o-amino-t-butyl-phenyl)ether, para-bis-(2-methyl-4-amino-phenyl)benzene, para-bis-(1,1-dimethyl-5-amino-pentyl)benzene, m-xylylene diamine, p-xylylene diamine, oxydianiline-(4,4'-diaminodiphenylether), ketodianiline, 4,4'-diamino-diphenyl sulfide, 3,3'-diamino-diphenyl sulfide, 4,4'-diamino-diphenyl sulfone, 3,3'-diamino-diphenyl sulfone, bis-(para-aminocyclohexyl)methane, bis-(para-amino-cyclohexyl)ethane, bis-(para-amino-cyclohexyl)propane, bis-(para-amino-cyclohexyl)sulfide, bis-(para-amino-cyclohexyl)sulfone, bis-(para-amino-cyclohexyl)ether, bis-(para-amino-cyclohexyl)diethyl silane, bis-(para-amino-cyclohexyl)diphenyl silane, bis-(para-amino-cyclohexyl)ethyl phosphine oxide, bis-(para-amino-cyclohexyl)phenyl phosphine oxide, 1,2-bis-(3-amino-propoxy)ethane, 2,2-dimethyl propylene diamine, 3-methoxy-hexamethylene diamine, 2,5-dimethylheptamet hylene diamine, 5-methylnonamethylene diamine, 1,4 diaminocyclohexane, 1,2-diamino-octadecane, 2,5-diamino-1,3,4-oxadiazole.

The bismaleimides used in this invention correspond to the following general formula:

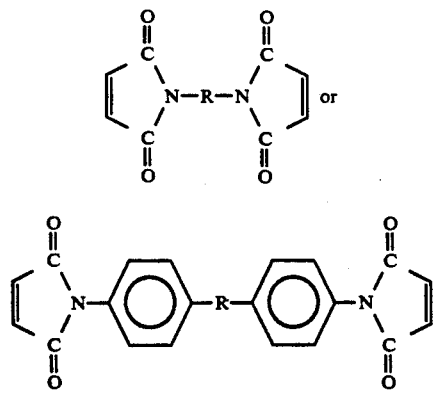

wherein R is selected from the groups consisting of aromatic group, aliphatic group, cycloaliphatic group and aliphatic group containing silaxone. Examples of typical bismaleimides are as follows: N,N'-ethylene-bis-maleimide, N,N'-butylene-bis-maleimide, N,N'-phenylene-bis-maleimide, N,N'-hexamethylene-bis-maleimide, N,N'-4,4'-diphenyl methane-bis-maleimide, N,N'-4,4'-diphenyl ether-bis-maleimide, N,N'-4,4'-diphenyl sulfone-bis-maleimide, N,N'-4,4'-dicyclohexyl methane-bis-maleimide, N,N'-xylylene-bis-maleimide, N,N'-diphenyl cyclohexane-bis-maleimide and the like.

The barbituric acids used correspond to the following general formula:

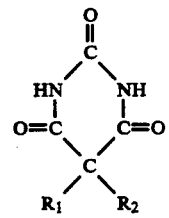

wherein $R_1$ and $R_2$ is respectively selected from the groups consisting of —H, —$CH_3$, —$C_2H_5$, —$C_6H_5$, —$CH(CH_3)_2$, —$CH_2CH(CH_3)_2$, —$CH_2CH_2CH(CH_3)_2$ and —$CH(CH_3)CH_2CH_2CH_3$.

DESCRIPTION OF THE PREFERRED EMBODIMENTS

Example 1

(A) The preparation of modified bismaleimide 8.66 g N,N'-4,4'-diphenyl methane-bis-maleimide was dissolved in 20 g butyrolactone. After the addition of 1 g barbituric acid, the resulted solution was stirred at 110° C. for one hour.

(B) The preparation of polyamic acid

In a 500 ml four-neck reactor, 17.45 g 4,4'-diaminodiphenyl-ether (DDE) was added and dissolved in the mixture of 130 ml NMP and 30 ml xylene. Under nitrogen atmosphere, 18.55 g (0.085M) pyromellitic dianhydride (PMDA) was added and reacted for three hours while maintaining the agitation. By further addition 0.436 g (0.02M) PMDA and reaction for two hours, polyamic acid solution with 18.5% solids content was obtained.

30 g modified bismaleimide obtained on process (A) was dissolved in 1.88 g polyamic acid formed in process (B) at room temperature. 8.9 g NMP was added to the resulting solution to 15% solids content. The final product was electrophoretically applied to the degreased Cu plate and baked according to the condition described as listed below to form a smooth, uniform film.

a. First, temperature is raised to 100° C. within 30 minutes and is maintained at 100° C. for one hour.

b. Right after that, temperature is raised from 100° C. to 200° C. within one hour and and is maintained at 200° C. for one hour.

c. Then, the temperature is raised from 200° C. to 300° C. within one hour and is maintained at 300° C. for one hour.

d. Furthermore, the temperature is raised from 300° C. to 350° C. for 30 minutes and is maintained at 350° C. for 30 minutes.

e. Finally, temperature is cool down to room temperature within three hours.

The Cu foils used in this Example includes two varieties. One is TCPI (trademark of Nippon Mining Co. Ltd.) and the other is made by Taiwan Copper Foil Co. Ltd. The adhesion of the copper to the polyimides substrate formed in this Example is measured by a Peel Strength Tester and the results are listed on Table I. The physical properties of the final product obtained are similar to those of the prior polyimides substrate.

Example 2

(A) The preparation of modified bismaleimide 11.55 g N,N'-4,4'-diphenyl methane-bis-maleimide was dissolved in 25 g γ-butyrolactone. After the addition of 1 g barbituric acid, the resulted solution was heated at 120° C. for one hour while maintaining the agitation.

(B) The preparation of polyamic acid

In a 500 ml four-neck reactor, 13.8 g 4,4'-diaminodiphenyl-ether (DDE) was added and dissolved in the mixture of 130 ml NMP and 30 ml xylene. Under nitrogen atomsphere, 20.93 g (0.065M) benzophenone tetracarboxylic dianhydride (BTDA) was added and reacted for three hours while maintaining the agitation. By further addition 1.288 g (0.004M) BTDA and reaction for two hours, polyamic acid solution with 18.4% solids content was obtained.

30 g modified bismaleimide obtained on process (A) was dissolved in 1.8 g polyamic acid formed in process (B) at room temperature. 11 g NMP was added to the resulting solution to 15% solids content. The final product was applied to the degreased Cu foil and baked according to the conditions as described in Example 1 to form a smooth, uniform film. The peel strength of the final product of this Example was also listed in Table I.

Comparison Example 1

0.62 g N,N'-4,4'-diphenyl-methane-bis-maleimide was dissolved in 10.5 g NMP. After the addition of 30 g polyamic acid obtained from process (B) of Example 1, the final product was applied to the degreased Cu foil and baked according to the conditions as described in Example 1. The peel strength of the final product was listed in Table I.

Comparison Example 2

Polyamic acid obtained from process (B) of Example 1 was directly applied to the degreased Cu foil and baked according to the conditions as described in Example 1. The peel strength of the Example was listed in Table I.

Comparison Example 3

0.61 g N,N'-4,4'-diphenyl methane-bis-maleimide was dissolved in 10.3 g NMP. After the addition of 30 g polyamic acid obtained from process (B) of Example 2, the final product was applied to the degreased Cu foil and baked according to the conditions as described in Example 1. The peel strength of the final product was listed in Table I.

Comparison Example 4

Polyamic acid obtained from process (B) of Example 2 was directed applied to the degreased Cu foil and baked according to the conditions as described in Example 1. The peel strength of the Example was listed in Table I.

TABLE I

| Runs Peel strength (lb/in) | Ex. 1 | Ex. 2 | Com- parison | Ex. 1 | Ex. 2 | Ex. 3 | Ex. 4 |
|---|---|---|---|---|---|---|---|
| TCPI | 8 | 6.5 | | 4.5 | 8.2 | 6.7 | 4.5 |
| Taiwan Cu Plate | 6 | 3.5 | | 3 | 6 | 3.4 | 3.2 |

Although the present invention has been described in detail, it will be understood by those of ordinary skill in the art that various modifications can be made, without departing from the spirit and scope of this invention. Accordingly, it is not intended that this invention be limited, except as by the appended claims.

I claim:

1. A polyimide adhesive composition comprising the reaction product of polyamic acid and bismaleimide modified by barbituric acid or a derivative thereof.

2. A polyimide adhesive comprising a heat curable resin composition which includes polyamic acid and bismaleimide modified by barbituric acid or a derivative thereof.

3. A polyimide adhesive composition as claimed in claim 1 or 2, wherein said barbituric acid corresponds to the following formula:

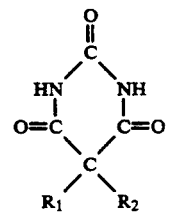

wherein $R_1$ and $R_2$ are independently selected from the group consisting of —H, —$CH_3$, —$C_2H_5$, —$C_6H_5$, —$CH(CH_3)_2$—$CH_2CH(CH_3)_2$, —$CH_2CH_2CH(CH_3)_2$ and —$CH(CH_3)CH_2CH_2CH_3$.

4. A polyimide adhesive composition as claimed in claim 1 or 2 wherein said bismaleimide has the structural formula

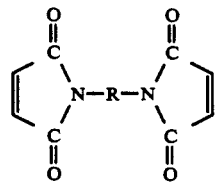

wherein R is an aromatic group, an aliphatic group, a cycloaliphatic group, an aliphatic group containing siloxane or Ph—$R^1$—Ph; Ph is phenyl; and $R^1$ has the same meanings as R.

5. A polyimide adhesive composition as claimed in claim 1 or 2, wherein the molar ratio of said barbituric acid to said bismaleimide is in the range of between ⅛ and 1/10.

6. A polyimide adhesive composition as claimed in claim 1 or 2, wherein the percent solids of said modified bismaleimide is in the range of from 5 to 15 percent by weight of the total solids as determined prior to reaction with said polyamic acid.

7. A polyimide adhesive composition as claimed in claim 1 or 2 wherein said polyamic acid is the reaction product of
(i) $H_2N$—R'—$NH_2$ and
(ii)

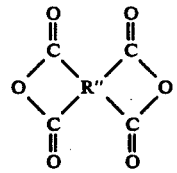

wherein R' and R" are independently selected from the group consisting of an aromatic group, an aliphatic group, a cycloaliphatic group and an aliphatic group containing siloxane.

* * * * *